United States Patent [19]

Tseng et al.

[11] Patent Number: 5,903,744
[45] Date of Patent: May 11, 1999

[54] LOGIC EMULATOR USING A DISPOSABLE WIRE-WRAP INTERCONNECT BOARD WITH AN FPGA EMULATION BOARD

[75] Inventors: Allen Hui-Wan Tseng, Mississauga, Canada; Hung Van Tang, San Jose; Vinh Coung Ta, Pleasant Hill, both of Calif.

[73] Assignee: Logic Express System, Inc., Fremont, Calif.

[21] Appl. No.: 08/856,551

[22] Filed: May 15, 1997

[51] Int. Cl.[6] ............................ G06F 9/455; G06F 13/00
[52] U.S. Cl. .......................................................... 395/500
[58] Field of Search ................................... 395/500, 308; 439/49, 61; 364/488–491

[56] References Cited

U.S. PATENT DOCUMENTS

| | | | |
|---|---|---|---|
| 3,675,083 | 7/1972 | White et al. | 446/83 |
| 4,031,371 | 6/1977 | De Vries | 235/152 |
| 4,195,896 | 4/1980 | Wagner et al. | 439/54 |
| 5,036,473 | 7/1991 | Butts et al. | 364/489 |
| 5,055,973 | 10/1991 | Mohsen | 361/414 |
| 5,077,451 | 12/1991 | Mohsen | 174/261 |
| 5,109,353 | 4/1992 | Sample et al. | 364/578 |
| 5,114,353 | 5/1992 | Sample | 439/65 |
| 5,321,322 | 6/1994 | Verheyen et al. | 307/465 |
| 5,329,470 | 7/1994 | Sample et al. | 364/578 |
| 5,352,123 | 10/1994 | Sample et al. | 439/61 |
| 5,377,124 | 12/1994 | Mohsen | 364/488 |
| 5,400,262 | 3/1995 | Mohsen | 364/489 |
| 5,414,638 | 5/1995 | Verheyen et al. | 364/489 |
| 5,425,036 | 6/1995 | Liu et al. | 371/23 |
| 5,438,617 | 8/1995 | Hill et al. | 379/327 |
| 5,440,453 | 8/1995 | Cooke et al. | 361/790 |
| 5,448,496 | 9/1995 | Butts et al. | 364/489 |
| 5,452,231 | 9/1995 | Butts et al. | 364/489 |
| 5,477,475 | 12/1995 | Sample et al. | 364/578 |
| 5,537,341 | 7/1996 | Rose et al. | 364/579 |
| 5,572,710 | 11/1996 | Asano et al. | 396/500 |
| 5,574,388 | 11/1996 | Barbier et al. | 326/41 |
| 5,644,515 | 7/1997 | Sample et al. | 364/578 |
| 5,712,806 | 1/1998 | Hennenhoefer et al. | 364/578 |
| 5,737,578 | 4/1998 | Hennenhoefer et al. | 395/500 |

*Primary Examiner*—Kevin J. Teska
*Assistant Examiner*—Ayni Mohamed
*Attorney, Agent, or Firm*—Stuart T. Auvinen

[57] ABSTRACT

A hardware-based emulator is partitioned onto two boards. An emulation board has field-programmable gate array (FPGA) chips mounted on a top surface, and connection posts protruding through to the bottom surface. The I/O pins of the FPGA chips that carry emulated signals are connected to the connection posts but not directly to other FPGA chips on the emulation board. An interconnection board has a grid of wire-wrap posts. The tops of the wire wrap-posts mate with the connection posts when the emulation board is plugged in to the interconnection board. The wire-wrap posts extend through the interconnection board and out the bottom surface. Interconnection is made by wire-wrap wires wound around the wire-wrap posts. Thus interconnection between FPGA chips on the emulation board is made by wire-wrap on the interconnection board, while the logic gates are emulated in the FPGA chips on the separate emulation board. The interconnection can be changed by discarding the interconnection board and wrapping a new interconnection board, while using the same FPGA's on the emulation board. FPGA's are not needed for interconnecting other FPGA chips, thus reducing cost.

21 Claims, 9 Drawing Sheets

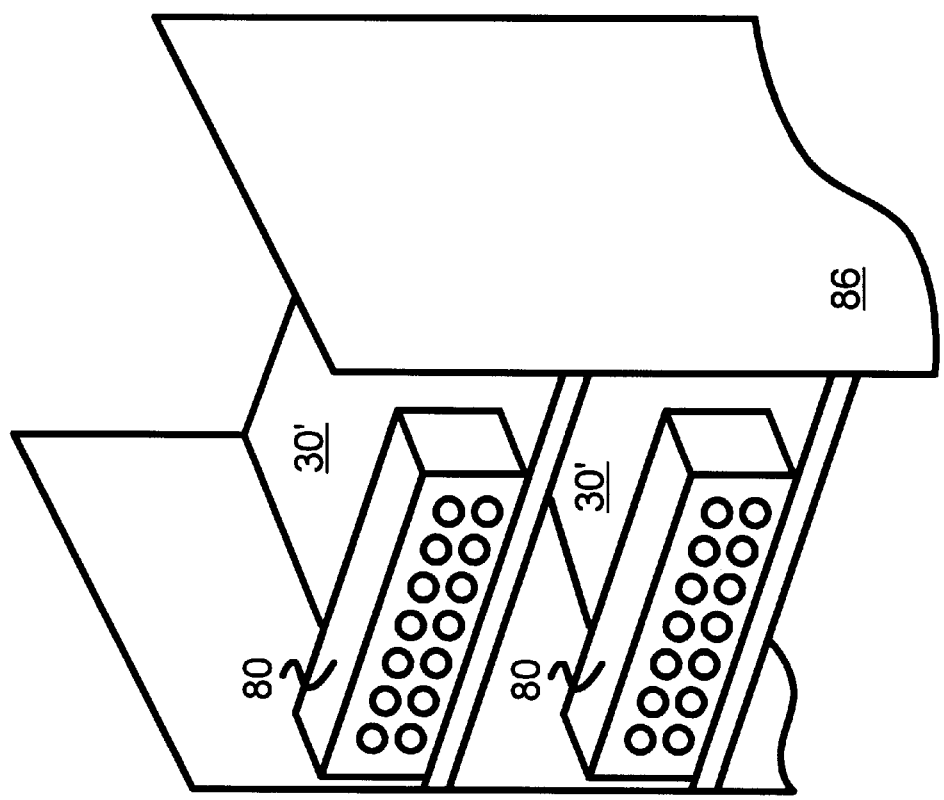
FIG. 9
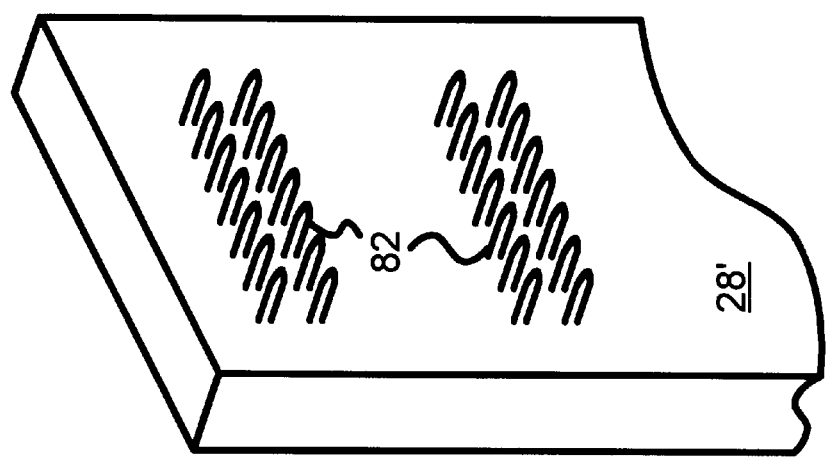

LOGIC EMULATOR USING A DISPOSABLE WIRE-WRAP INTERCONNECT BOARD WITH AN FPGA EMULATION BOARD

BACKGROUND OF THE INVENTION

1. Field of the Invention

This invention relates to hardware emulation systems using field-programmable gate arrays (FPGA's), and more particularly to an emulator using a disposable wire-wrap board for interconnecting FPGA's.

2. Description of the Related Art

Digital circuits and systems have become ever more complex and difficult to debug. Designers often use software-based simulators to validate or test their designs before manufacturing silicon prototypes, but the extent of the testing is limited by the relatively slow speed of the software simulator. Although software simulators are relatively inexpensive, they are slow since they simulate the logic gates of the design using routines of instructions such as single-bit write and test instructions. Logical states of nodes may have to be stored in a main memory or even on a hard disk, further slowing simulation. Complex designs such as microprocessors often require millions of test vectors which can occupy days or weeks of software simulation time.

Higher-speed hardware-based emulators have emerged to accelerate design validation, allowing millions of test vectors to be executed before a silicon prototype is manufactured. Actual application programs for the target design can be executed on the hardware-based emulator. Hardware-based emulators are commercially available from companies such as IKOS Systems of Cupertino, Calif., Aptix Corp. of San Jose, Calif., and Quickturn Systems of Mountain View, Calif.

These hardware-based emulators emulate the design's logic gates using real hardware logic gates in a field-programmable gate array (FPGA) rather than with logical instructions executed on a microprocessor. FPGA's are commercially available from such firms as Altera of San Jose, Calif., Xilinx of San Jose, Calif., and Actel of Sunnyvale, Calif.

HARDWARE EMULATORS USE FPGA CHIPS FOR RE-PROGRAMMABLE INTERCONNECTIONS

Hardware emulators also use FPGA's for interconnection as well as for the logic gates being emulated. For example, U.S. Pat. No. 5,352,123 by Sample et al. and assigned to Quickturn Systems of Mountain View, Calif. shows a multi-board emulator with FPGA chips for both logic emulation and for interconnecting other FPGA's.

FIG. 1 is a diagram of a prior-art hardware-based emulator using FPGA chips for interconnection. Emulation board 16 contains several FPGA chips 10 which are programmed to contain some of the logical gates in a design being emulated. These logical gates are connected together with each of the FPGA chips 10 using internal interconnect, but some gates must be connected to gates in other FPGA chips. Thus other FPGA chips are used as switch chips 12. Switch chips 12 are simply used for interconnecting FPGA chips 10 to each other and to other boards. The logic gates within switch chips 10 are generally not used since switch chips 10 simply function as a cross-bar switch.

Larger designs cannot be fit on a single emulation board, so connection must be made to other emulation boards. Switching board 18 also contains FPGA programmed as cross-bar switches 14. These FPGA cross-bar switches form programmable connections from switch chips 12 on emulation board 16 to other emulation boards. Thus a large design can be emulated by connecting many emulation boards to switch board 18. External inputs and outputs (I/O) also connect to cross-bar switches 14.

Such hardware emulators can be re-programmed to emulate other designs, and thus can be re-used over and over again. However, such emulators are expensive and can cost hundreds of thousands or millions of dollars. Often more FPGA's are needed for the interconnection than for the logic gates being emulated. Larger emulators in particular can require many cross-bar switch FPGA's when any FPGA can be connected to any other FPGA. Thus many of the FPGA's are used simply for interconnect. Indeed, more FPGA's are used for interconnection than for logic-gate emulation on some systems, requiring additional circuit-board area for the interconnection FPGA's.

The interconnection architectures in U.S. Pat. Nos. 5,352,123 and 5,414,638 provide interconnection from any pin of a user component to any pin of another user component. A common disadvantage of these architectures is the use of many interconnection chips to make these connections. Using interconnection chips increases timing delays, chip counts, and board space, resulting in a slower, larger, complicated and expensive system.

CUSTOM PCB'S WITH FPGA'S

Designs in netlist form can be read, synthesized, partitioned and loaded into multiple FPGA's using a FPGA compiler such as Altera's MAXPLUS II. A report file from the compiler specifies the interconnection between FPGA chips. The system can then be prototyped by programming the FPGA's and creating a custom PCB with the interconnection specified by the report file.

Unfortunately, interconnection using custom PCB's must go through layout, component placement, routing of nets, assembly, and testing. Designing and manufacturing custom PCB's can take weeks, and each new design must have a new custom PCB made. More extensive changes to a design often require a new PCB layout.

What is desired is a hardware-based emulator using FPGA's for logic-gate emulation but not using FPGA's for interconnection. It is desired to reduce cost and timing delay by eliminating interconnection FPGA's while still using FPGA's for logic emulation. It is desired to segregate the relatively expensive FPGA's from the less expensive interconnect. Fast prototyping is desired for the interconnect. PCB interconnect is desired to be replaced with a more rapidly constructed interconnection technology.

SUMMARY OF THE INVENTION

A hardware-based emulator emulates a user design of user-defined logic gates and user-defined interconnections of user-defined signals with the user-defined logic gates. A reusable emulation board has field-programmable gate-array (FPGA) chips mounted on a first substrate. The FPGA chips include re-programmable means for configuring logic cells into the user-defined logic gates in response to configuration commands input to programming pins on the FPGA chips. Emulation I/O pins on the FPGA chips are coupled to the user-defined signals that are inputs and outputs of the logic cells of the FPGA chips configured as the user-defined logic gates. Connection terminals on the reusable emulation board are coupled to the emulation I/O pins of the FPGA chips.

A disposable interconnection board is a second substrate separate from the first substrate. Connection receptacles attached to the second substrate make electrical contact with the connection terminals when the disposable interconnection board is plugged into the re-usable emulation board.

Wire-wrap posts are attached to the second substrate. The posts are electrically connected to the connection receptacles. Wire-wrap wires are connected between the wire-wrap posts to make electrical connections between wire-wrap posts corresponding to the user-defined interconnections of the user-defined signals. Thus electrical interconnection between the FPGA chips on the re-usable emulation board is made by the wire-wrap wires on the disposable interconnection board.

In further aspects of the invention, the wire-wrap wires are tightly wound around the wire-wrap posts to make electrical connection. The wire-wrap wires are conductive metal wires surrounded by electrical insulation. The electrical insulation remains on the wire-wrap wires between wire-wrap posts to prevent electrical shorts to other wires or other wire-wrap posts. The electrical insulation is stripped off the ends of the wire-wrap wires wound around the wire-wrap posts. The wire-wrap wires are not soldered to the wire-wrap posts.

In still further aspects of the invention the disposable interconnection board has no printed-circuit wiring traces formed therein for emulated signals. Thus electrical interconnection between the wire-wrap posts on the disposable interconnection board is provided only by the wire-wrap wires. The emulation I/O pins on the FPGA chips are not directly connected on the re-usable emulation board to other emulation I/O pins of other FPGA chips. All the user-defined signals that are not connected entirely within a single FPGA chip are connected to other FPGA chips through the disposable interconnection board. Thus all user-defined signals that are output from the FPGA chips are connected through the disposable interconnection board.

BRIEF DESCRIPTION OF THE DRAWINGS

FIG. 9 is a detail of connectors to a single interconnection board on multiple emulation boards.

DETAILED DESCRIPTION

The present invention relates to an improvement in hardware-based emulators. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
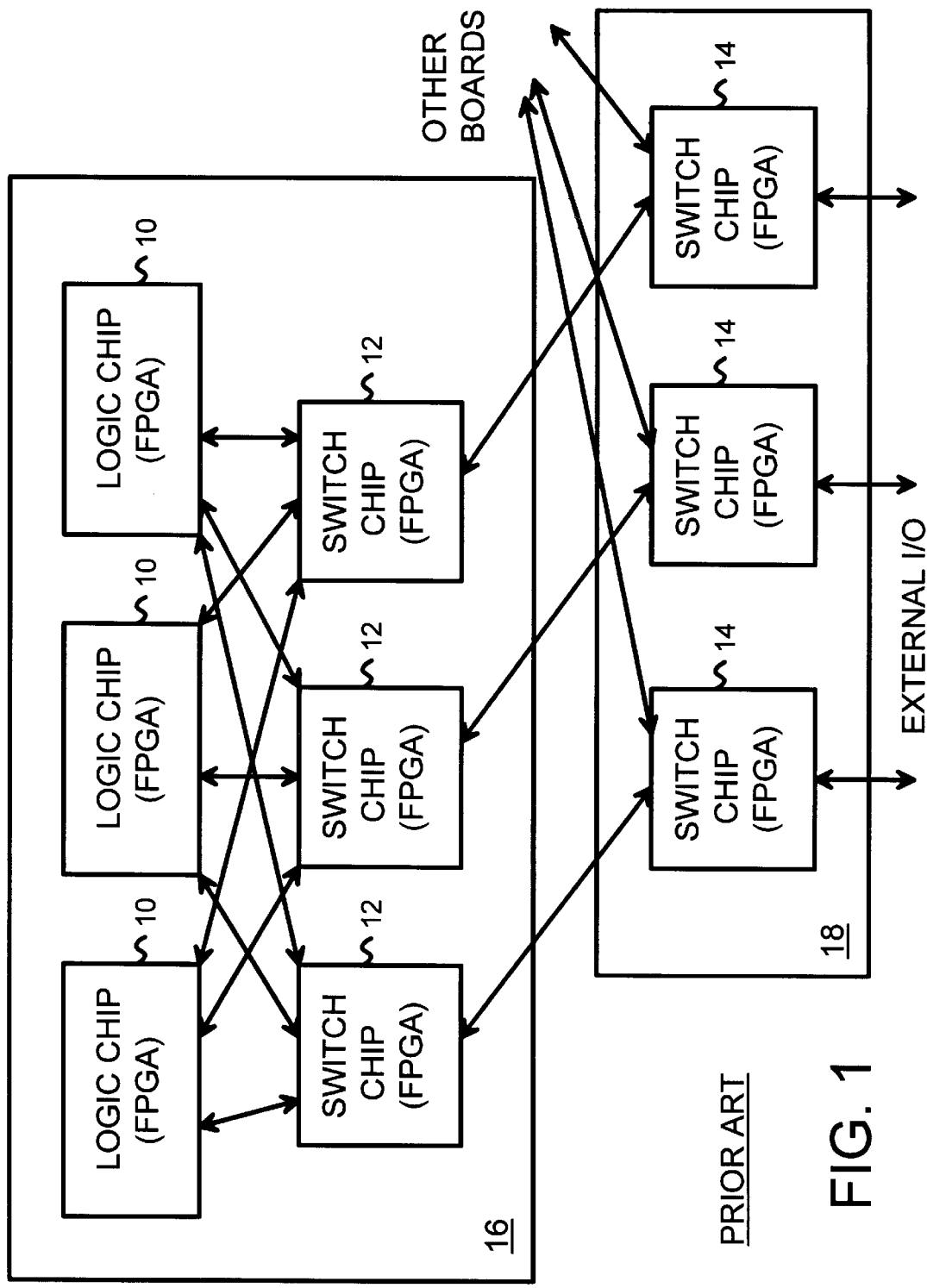
FIG. 1 is a diagram of a prior-art hardware-based emulator using FPGA chips for interconnection.
Figure 2:
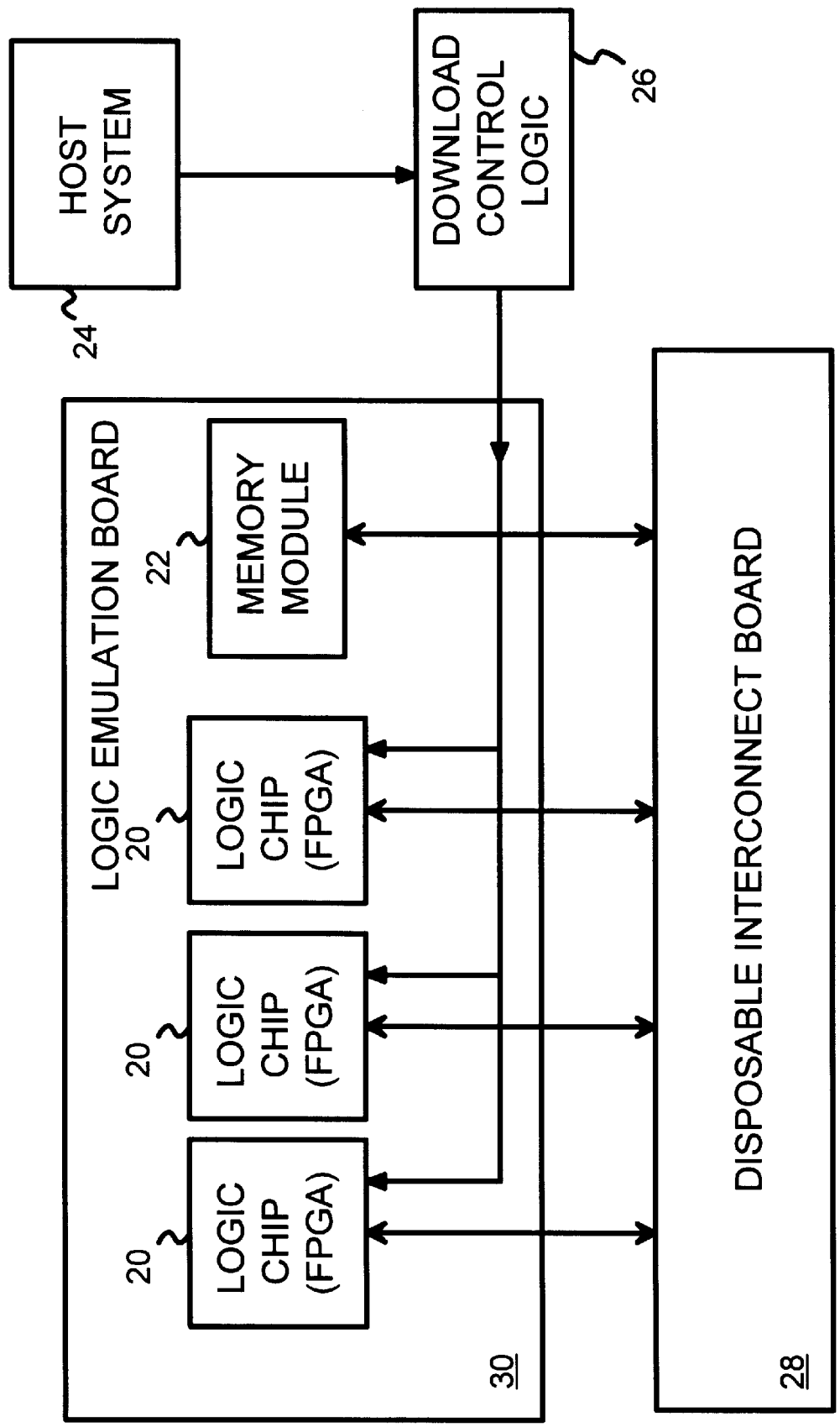
FIG. 2 is a block diagram of a hardware-based emulator with a disposable interconnect board partitioned from the FPGA's.

FIG. 2 is a block diagram of a hardware-based emulator with a disposable interconnect board partitioned from the FPGA's. FPGA logic chips 20 are mounted on logic emulation board 30, but are not interconnected together on emulation board 30. Instead, the signal I/O pins from FPGA logic chips 20 are connected to a second board, disposable interconnection board 28. Connection of signals between FPGA logic chips 20 is made by interconnection on interconnection board 28 rather than on emulation board 30.

INTERCONNECT BOARD IS DISPOSABLE

Interconnection is thus segregated to a separate interconnection board 28, while the expensive FPGA logic chips 20 are on a separate emulation board 30. The FPGA logic chips 20 can be re-used, while interconnection board 28 can be disposed of for each new design emulated. Since interconnection board 28 contains no FPGA chips, the cost of interconnection board 28 is much less than the cost of emulation board 30.

Interconnection board 28 uses wire-wrap to form interconnection for the FPGA's on emulation board 30. Wire-wrap is a quick prototyping technology requiring no etching of metal traces on a PCB. Automated and semi-automated wire-wrap machines can read a connection file of x,y coordinates of wire-wrap posts or terminals, and wrap small wires around the specified posts to form connections between pairs of posts. Thus interconnection can be rapidly made.

Once interconnection board 28 is wire-wrapped for the desired connections, it is plugged into emulation board 30, providing interconnection between FPGA logic chips 20. Different designs can be emulated by plugging into the same emulation board 30 a different interconnection board 28 with different wire-wrapped interconnection.

When design changes are made, an entirely new interconnection board 28 can be wire-wrapped, or the change can be located by its interconnect wire's x,y coordinate and the interconnect wire removed and manually re-wrapped to form the new connection. Thus minor design changes can be made rapidly, while larger changes can be made by wrapping a new interconnect board.

Memory module 22 is also mounted on emulation board 30, perhaps using SIMM memory sockets. SRAM cache or DRAM main memory can be provided and emulated using memory module 22. Memory module 22 is connected to FPGA logic chips 20 by wire-wrap interconnect on interconnection board 28.

Once interconnection board 28 is wire-wrapped and plugged into emulation board 30, the FPGA's must be programmed. Programming causes the FPGA chips to enable logic gates and internally connect them together and to the I/O pins of the FPGA chips. The FPGA chips provide an array of multi-purpose logic cells which are individually programmed for the desired logical function such as AND, NOR, XOR, AND-OR-Invert, and various flip-flops. Programming is specified by a file downloaded from host system 24 to FPGA logic chips 20. Download control logic 26 activates special programming-signal paths from host system 24 to FPGA logic chips 20.

FPGA'S ON SEPARATE BOARD FROM INTERCONNECT

Figure 3:
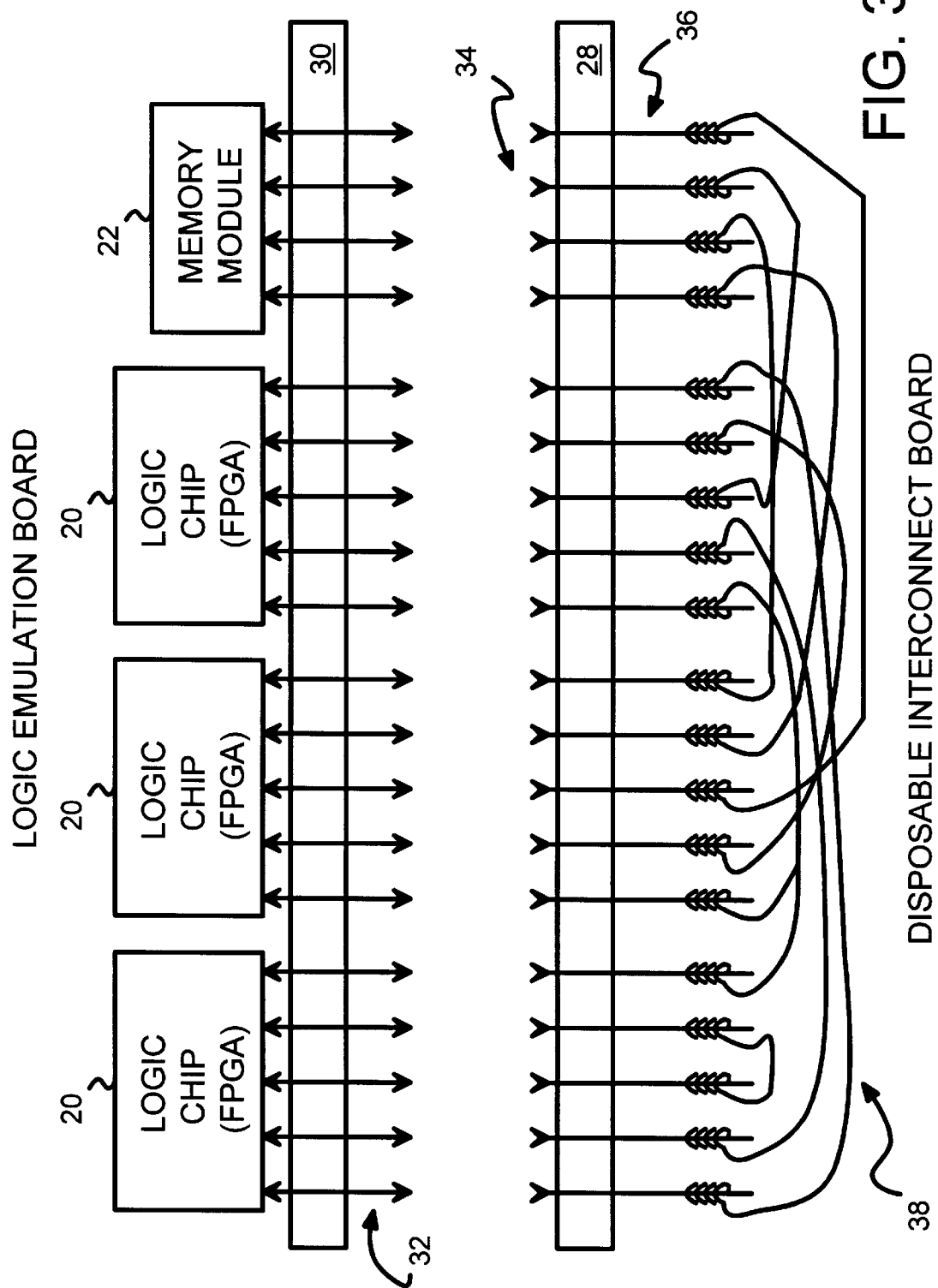
FIG. 3 is a diagram highlighting a separate wire-wrap interconnection board for plugging into an FPGA emulation board.

FIG. 3 is a diagram highlighting a separate wire-wrap interconnection board for plugging into an FPGA emulation board. FPGA logic chips 20 have their I/O signal pins routed through emulation board 30 to connector posts 32. Connector posts 32 may be located directly under the corresponding pins of FPGA logic chips 20. An alternative is for connection posts 32 to be in a regular grid or array, but not necessarily directly under the I/O pins of FPGA logic chips 20. Then some local wiring traces patterned on emulation board 30 are used to route the I/O pins of FPGA logic chips 20 to connector posts 32. Memory module 22 is likewise connected to connector posts 32.

Some overhead signals to FPGA chips 20 are connected among all FPGA chips 20. Overhead signals include global clocks, FPGA programming controls and programming data, chip selects, and power and ground. Emulated signals of the design are all connected to other FPGA chips through connector posts 32 and interconnection board 28 rather than directly to other FPGA chips on emulation board 30. This allows all the interconnection to be programmable by wire-wraps on interconnection board 28.

Interconnection board 28 is a separate board with a separate PCB substrate from emulation board 30. Connector posts 32 of emulation board 30 are arranged to plug into connector cups 34 on a top surface of interconnection board 28. Connector cups 34 may be low-insertion-force sockets, or deeper, tighter-fitting plugs to make a more secure mechanical and electrical contact to connector posts 32. For an emulation board 30 with 10 FPGA chips each having 100 signal I/O pins, 10×100 or 1,000 connector posts 32 are needed.

Connector cups 34 are electrically connected to the tops of wire wrap posts 36, which extend through the substrate of interconnect board 28. The substrate of interconnect board 28 is a simple printed-circuit board with regular holes drilled for mounting a grid of wire-wrap posts. Since wiring traces are not needed on interconnect board 28, an expensive multi-layer PCB is not needed.

BLANK INTERCONNECT BOARDS WIRE-WRAPPED TO MAKE SPECIFIC CONNECTIONS

Blank interconnect boards 28 can be mass-produced, reducing cost, since no specific interconnect is required. A blank interconnect board 28 is simply a board with wire wrap posts and connector cups arranged in a regular array.

When the user of the emulation system desires to perform emulation, a netlist of the design for emulation is compiled to generate a programming file to download to the FPGA's. An interconnect-map file is also generated. The interconnect-map file specifies how the FPGA's are connected together through wire-wrap on the interconnection board. The compiler determines the interconnect lines needed, and then generates x,y coordinates of wire-wrap posts that will be connected to the corresponding FPGA pins. Pairs of x,y coordinates are written to the interconnect-map file to specify which posts are connected together with a wire-wrap wire. An automated wire-wrap machine then reads the interconnect-map file and strips an end of a wire and wraps it around the post at the first x,y coordinate. The machine then routes the insulated wire between other posts and finally strips and wraps the wire around the post at the second x,y coordinate. Wire-wrap shops that perform rapid turn-around wire-wrapping for customers include Twin Industries, and Electronic Manufacturing Services, both of Santa Clara, Calif.

FIG. 3 shows each of wire-wrap posts 36 with an end of a wire wound tightly around the post to make electrical contact. Solder is not needed. Wire-wrap wires 38 for interconnection among pairs of wire-wrap posts 36, whether the posts are close together or located far apart on interconnection board 28.

EMULATION BOARD PLUGS INTO WRAPPED INTERCONNECT BOARD

Figure 4:
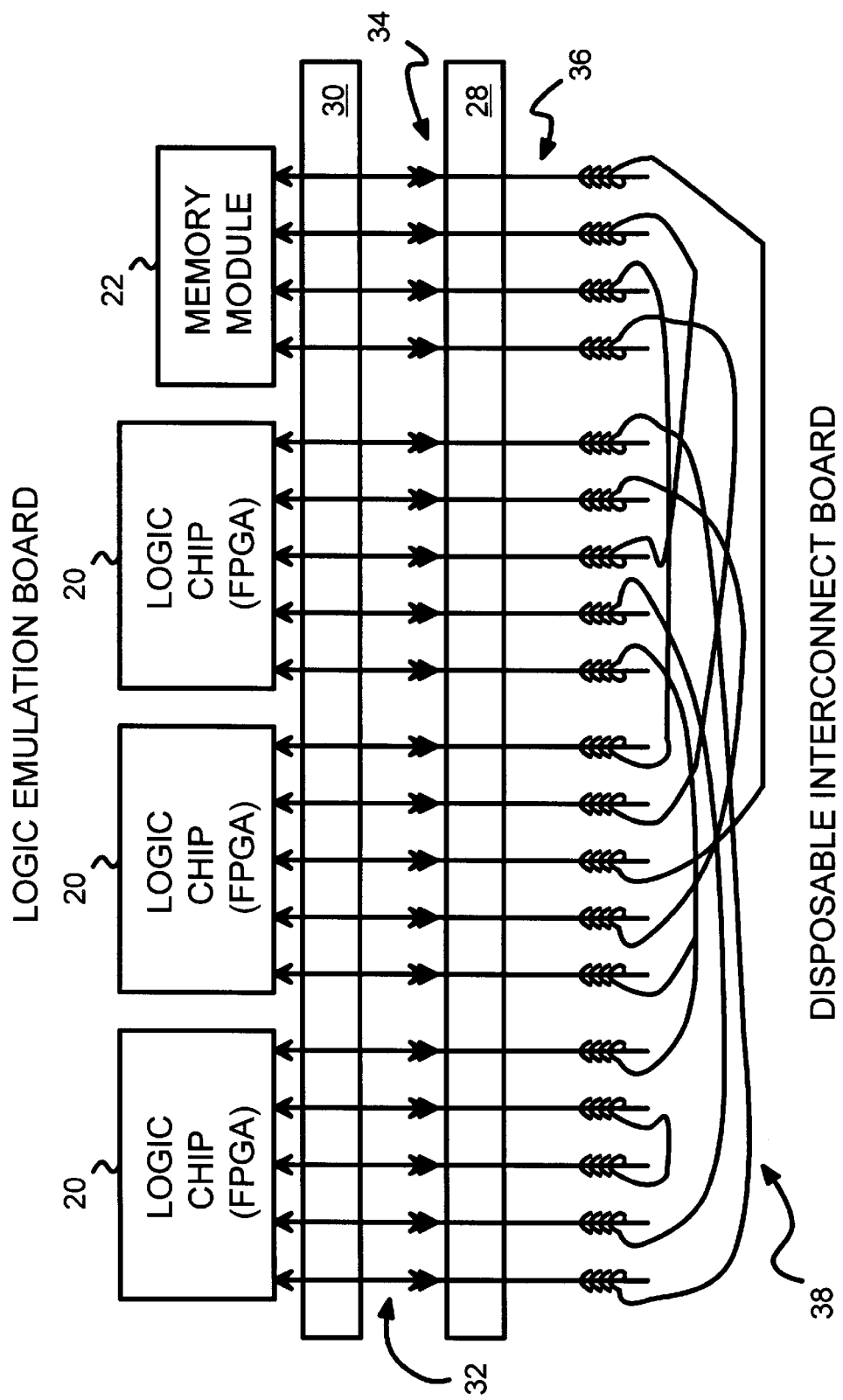
FIG. 4 is a diagram showing an interconnect board with FPGA's plugged into a wire-wrapped interconnection board.

FIG. 4 is a diagram showing an interconnect board with FPGA's plugged into a wire-wrapped interconnection board. Connection posts 32 are connected through the substrate of emulation board 30 to the I/O pins of FPGA logic chips 20. These connection posts 32 are plugged into connection cups 34 formed on the top of wire-wrap posts 36. Wires 38 form electrical connections between different FPGA logic chips 20 when emulation board 30 is plugged into interconnection board 28.

Wire-wrap posts 36 form an array or a grid with regular spacing. Wires 38 are ideally fitted between other wire-wrap posts 36 rather than above posts 36 as FIG. 4 shows for simplicity. The spacing of wire-wraps posts 36 can be expanded to allow wires to be fitted between posts. Wires 38 have electrical insulation such as a plastic sheath except at the ends wound around wire-wrap posts 36. The insulation allows wires 38 to touch other wires and posts without making electrical shorts.

FITTING EMULATION BOARD INTO INTERCONNECTION BOARD

Figure 5:
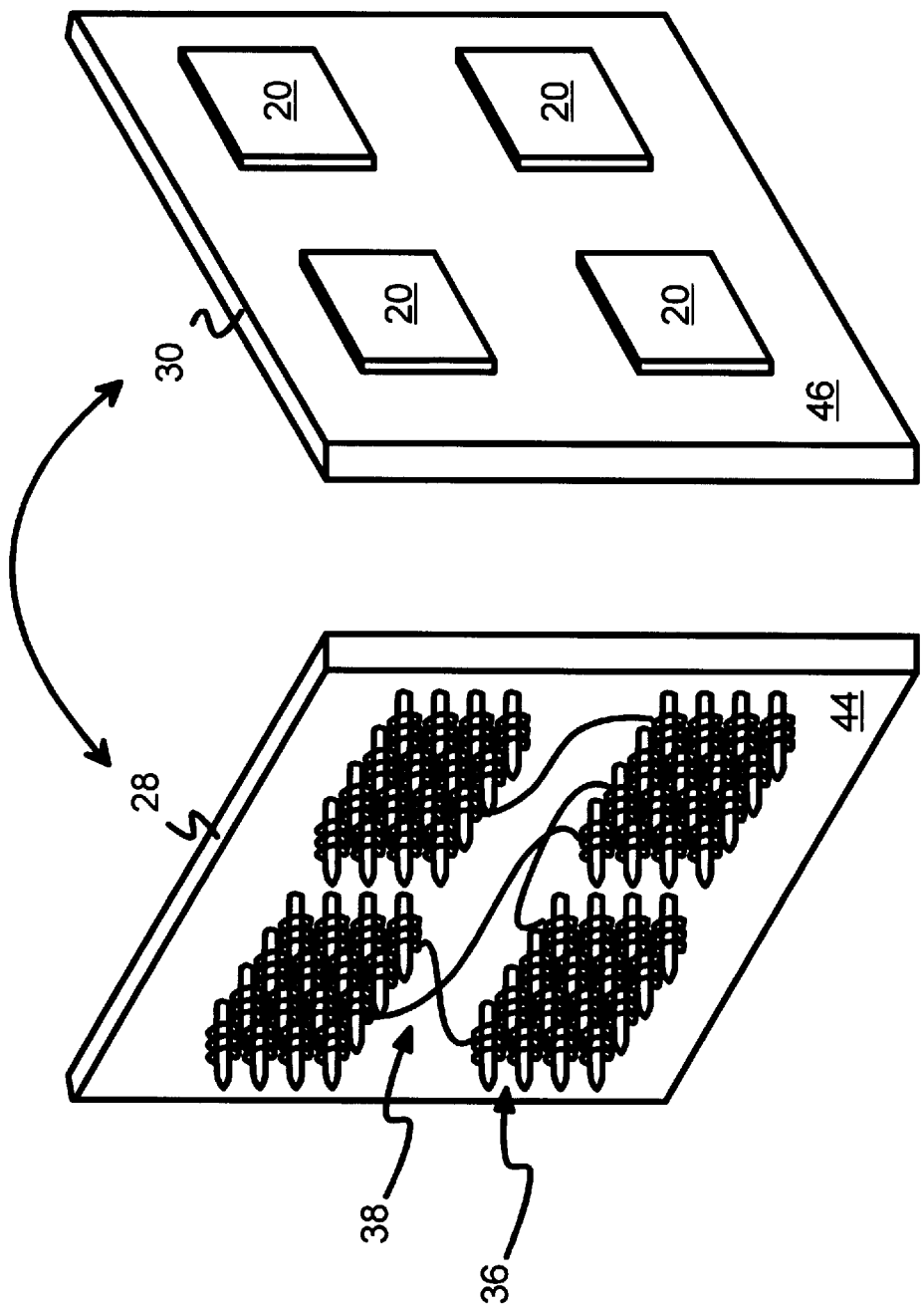
FIG. 5 shows the outer surfaces of the emulation board and the interconnection board as the boards are being plugged together.

FIG. 5 shows the outer surfaces of the emulation board and the interconnection board as the boards are being plugged together. Top surface 46 of emulation board 30 has four FPGA logic chips 20 mounted thereon. FPGA logic chips 20 may be surface-mount packages or pin-grid-array (PGA) packages. Sockets (not shown) may also be used for mounting FPGA logic chips 20. Some PCB wiring traces (not shown) on emulation board 30 are needed to connect power and ground to chips 20, I/O pins to connection posts 32, and to connect global signals such as clocks, programming control signals, and chip enables to chips 20 to allow for programming FPGA logic chips 20.

Bottom surface 44 of interconnect board 28 has one or more grids of wire-wrap posts 36. Wires 38 are wound around posts 36 and routed between the posts to make electrical connections. While only a few posts and wires are shown for clarity, an actual interconnection board 28 has a few thousand wire-wrap posts 36 and many wires, depending on the size and complexity of the emulated design. Most wires connect posts for different FPGA chips rather than posts for the same FPGA chip as shown in the simplified diagram.

When emulation board 30 is plugged into interconnect board 28, the inner surfaces are connected together and thus not visible. The outer surfaces are visible when the boards are plugged together (top surface 46 of emulation board 30 and bottom surface 44 of interconnect board 28 are the visible surfaces).

Figure 6:
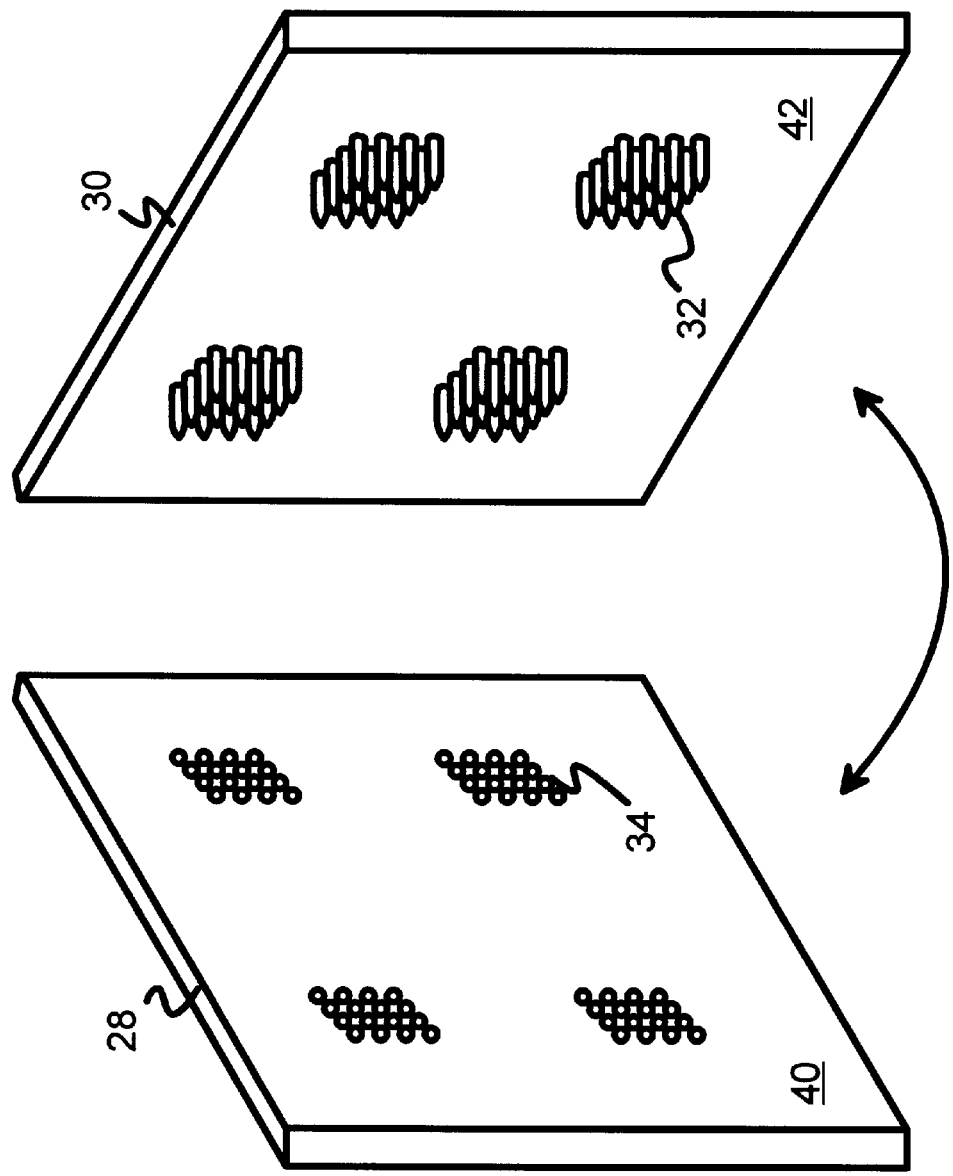
FIG. 6 shows the inner surfaces of the emulation board and the interconnection board as the boards are being plugged together.

FIG. 6 shows the inner surfaces of the emulation board and the interconnection board as the boards are being plugged together. Bottom surface 42 of emulation board 30 has connection posts 32 which fit into connection cups 34 on upper surface 40 of interconnection board 28. When boards 30, 28 are plugged together, most of inner surfaces 40, 42 are hidden.

FIGS. 5, 6 show an embodiment where connection posts 32 form four smaller grids located directly under FPGA logic chips 20. In actual systems many more pins are present on FPGA logic chips 20, and thus larger grids are needed. These grids can merge together to form one large grid for all chips without space between the grids as shown in FIGS. 5, 6.

MULTIPLE EMULATION BOARDS - FIGS. 7, 8, 9

Figure 7:
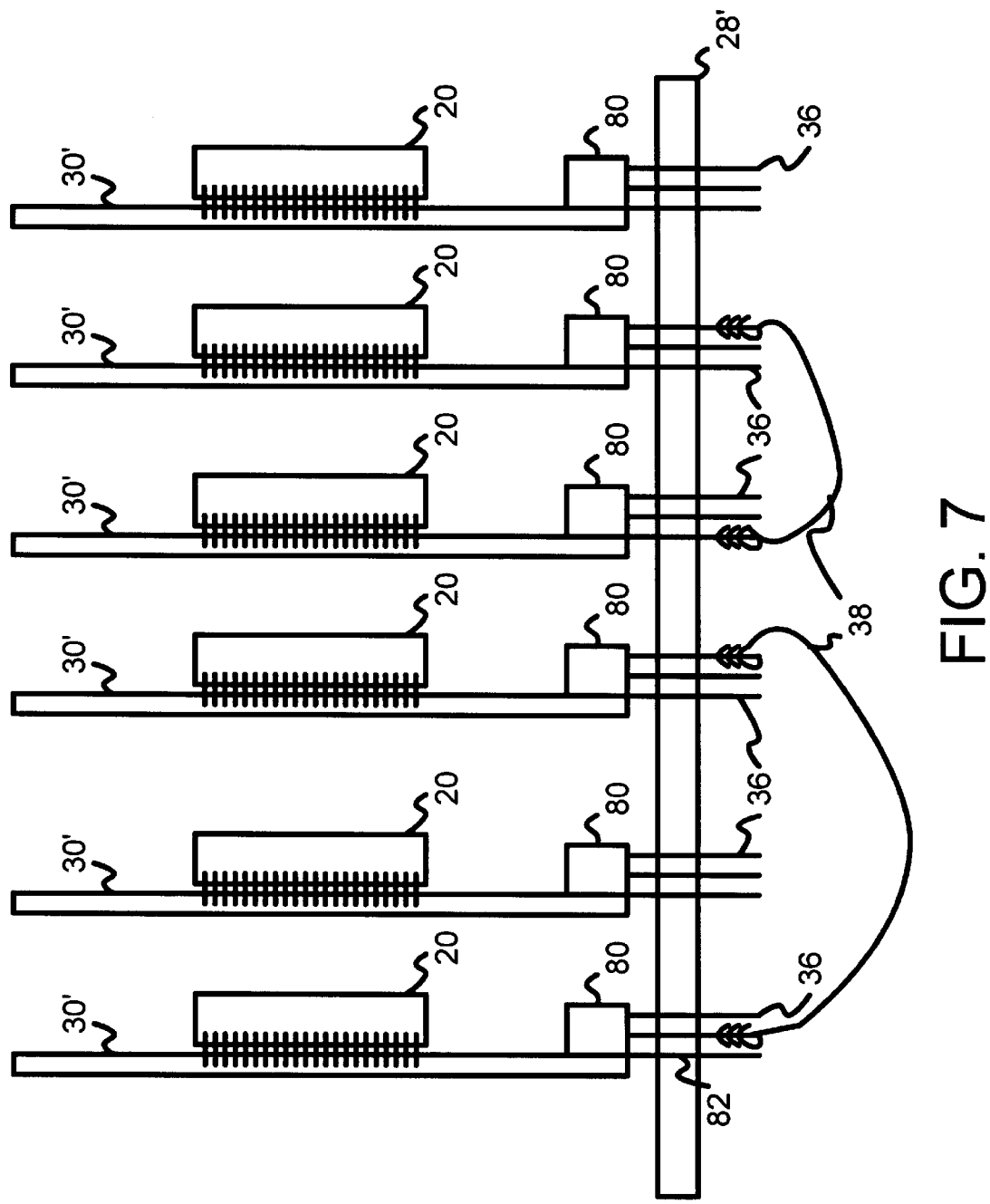
FIG. 7 is a diagram showing an alternate embodiment having multiple emulation boards connecting to a single interconnection board.

FIG. 7 is a diagram showing an alternate embodiment having multiple emulation boards connecting to a single interconnection board. Emulation boards 30' have one or more FPGA chips 20 mounted thereon. Instead of connecting to the interconnection board on the bottom surface, the interconnection board connects on the edge of emulation boards 30' though connectors 80. Pins 82 extend out from interconnection board 28' and plug into holes in connector 80. Multiple emulation boards 30' connect into a single interconnection board 28'. Connector 80 is a female-type connector.

Wire-wrap posts 36 are mounted on the backside of interconnection board 28'. Connector pins 82 are integral with wire-wrap post 36, which extend through the top surface of interconnection board 28'. Wire-wrap wires 38 are made between wire-wrap posts 36 to form the interconnection.

Figure 8:
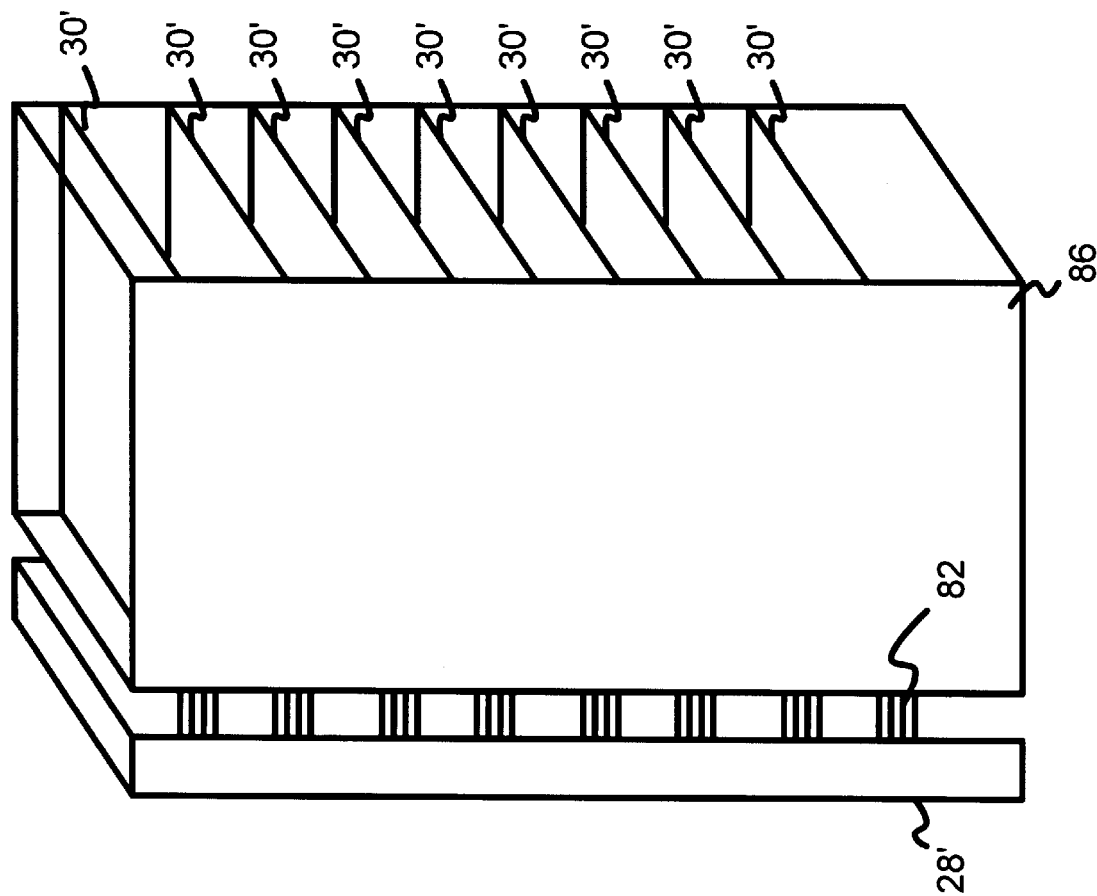
FIG. 8 illustrates multiple emulation boards connected to a single interconnection board in an emulator cage.

FIG. 8 illustrates multiple emulation boards connected to a single interconnection board in an emulator cage. Emulation boards 30' contain FPGA chips, but do not interconnect the emulated signals on different FPGA chips. A connector (not visible) at the edge of each of emulation boards plugs into connector pins 82 on interconnection board 28'. A chassis or emulator cage 86 has slots in the sides to support emulation boards 30'.

Wire-wrap is performed on interconnection board 28' to form interconnection between wire-wrap posts in interconnection board 28'. Each of emulation boards 30' is then slid into the slots on the sides of emulator cage 86 to make contact with connector pins 82 of interconnection board 28'. The host is connected to emulator cage 86 and emulation begins.

FIG. 9 is a detail of connectors to a single interconnection board on multiple-emulation boards. In this embodiment, standard multi-pin connectors 80 are mounted near the back edges of emulation boards 30'. The rear of emulator cage 86 is shown, where interconnection board 28' is attached into emulator cage 86. Connector pins 82' are on interconnection board 28' and plug into holes in multi-pin connectors 80 on emulation boards 30'. Connector pins 82' can be separate pins, or they can be the tops of dual-headers wire-wrap pins.

ADVANTAGES OF THE INVENTION

The invention provides a simpler, less-expensive hardware-based emulator. The switching FPGA's used in prior-art emulators are replaced with the wire-wrap interconnection board. Since wire-wrap is much less expensive than FPGA chips, the cost is reduced substantially. Timing delays through the prior-art's switching FPGA's are eliminated, increasing emulation speed. The size of the emulation system is reduced drastically in comparison to cross-bar FPGA emulators. Manufacturing these emulation systems is easier.

The wire-wrap interconnection board is quickly customized using an automated wire-wrap machine. Semi-automatic wire-wrap machines are also useful to automatically locate x,y coordinates of posts while allowing a skilled technician to actually make the wrap and place the wire. A blank interconnection board can be sent out to a wire-wrap shop for customization in a short time.

The emulator system can be used for different designs by swapping interconnect boards and downloading a different logic-gate configuration to the FPGA's. Thus the emulator can be used by different design teams.

The emulator system thus provides a lower cost system than prior-art emulators using FPGA chips for cross-bar switch interconnect, while providing faster prototyping than custom PCB which require several weeks for layout, component placement, trace-routing, and PCB fabrication and board assembly.

The FPGA logic chips can be connected to any other arbitrary FPGA logic chip, regardless of location. The connections available are not restricted as are some architectures using FPGA switches.

Emulator cost is further reduced by the simple architecture. Complex, multi-layer PCB's are not needed as interconnection is accomplished by wire wrap. The interconnection board may not need any wiring traces, or can have only a few traces for global clock signals. The interconnection board can simply be a bed of wire-wrap posts. Thus the interconnection boards can be manufactured at a very low cost. The emulator board is likewise simple, as the only wiring traces needed are for I/O signals routed to connector 80, power, ground, and global signals such as programming controls and clocks.

ALTERNATE EMBODIMENTS

Several other embodiments are contemplated by the inventors. For example only the I/O signal pins of the FPGA's need to be connected to the interconnection board. Other signals may be connected to all FPGA's, such as global clocks, programming enable signals, and of course power and ground. These are overhead signals to control FPGA programming and are not the emulated signals of the design. However, the outputs of the logic gates being emulated are the I/O signals that are not interconnected to other FPGA chips except through the interconnection board.

Many separate logic emulation boards can be plugged into one or more disposable interconnect boards, and these can in turn plug into a backplane bus or rack. The memory module can be eliminated or expanded for some emulation systems. The download control logic can be integrated onto the logic emulation board, or located on a separate board such as a main system board for the hardware emulator. Connectors or plugs can be added to the boards for connection to the host or to the download control logic.

A loose fit between the connection posts of the emulation board and the connection cups on the top of the wire-wrap post of the interconnect board is allowable when clamps are used. The clamps can exert pressure between the emulation board and the interconnection board to make firm contacts.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. A hardware-based emulator for emulating a user design of user-defined logic gates and user-defined interconnections of user-defined signals with the user-defined logic gates, the hardware-based emulator comprising:

a re-usable emulation board, having field-programmable gate-array (FPGA) chips mounted on a first substrate, the FPGA chips including re-programmable means for configuring logic cells into the user-defined logic gates in response to configuration commands input to programming pins on the FPGA chips;

emulation I/O pins on the FPGA chips, the emulation I/O pins coupled to the user-defined signals that are inputs and outputs of the logic cells of the FPGA chips configured as the user-defined logic gates;

connection terminals on the re-usable emulation board, coupled to the emulation I/O pins of the FPGA chips;

a disposable interconnection board, on a second substrate separate from the first substrate;

connection receptacles attached to the second substrate, for making electrical contact with the connection terminals when the disposable interconnection board is plugged into the re-usable emulation board;

wire-wrap posts, attached to the second substrate, and electrically connected to the connection receptacles; and wire-wrap wires connected between the wire-wrap posts, for making electrical connections between wire-wrap posts corresponding to the user-defined interconnections of the user-defined signals, whereby electrical interconnection between the FPGA chips on the re-usable emulation board is made by the wire-wrap wires on the disposable interconnection board.

2. The hardware-based emulator of claim 1 wherein a plurality of re-usable emulation boards with FPGA chips are connected to a single disposable interconnection board through a plurality of the connection terminals on the re-usable emulation boards, the connection terminals coupled to the emulation I/O pins of the FPGA chips.

wherein multiple re-usable emulation boards are connected to the disposable interconnection board.

3. The hardware-based emulator of claim 2 wherein the plurality of re-usable emulation boards are connected orthogonally to the single disposable interconnection board, wherein the connection terminals are edge-mounted connectors on each of the plurality of re-usable emulation boards.

4. The hardware-based emulator of claim 3 wherein the connection terminals comprise:

multi-pin connectors mounted near a rear edge of each of the plurality of re-usable emulation boards.

5. The hardware-based emulator of claim 4 wherein the wire-wrap wires comprise a conductive metal wire surrounded by electrical insulation, the electrical insulation remaining on the wire-wrap wires between wire-wrap posts to prevent electrical shorts to other wires or other wire-wrap posts, the electrical insulation being stripped off the ends of the wire-wrap wires wound around the wire-wrap posts and wherein the wire-wrap wires are not soldered to the wire-wrap posts.

6. The hardware-based emulator of claim 1 wherein the disposable interconnection board has no printed-circuit wiring traces formed therein for emulated signals other than for global clock signals, wherein electrical interconnection between the wire-wrap posts on the disposable interconnection board is provided only by the wire-wrap wires;

wherein the emulation I/O pins on the FPGA chips are not directly connected on the re-usable emulation board to other emulation I/O pins of other FPGA chips, and wherein all the user-defined signals that are not connected entirely within a single FPGA chip are connected to other FPGA chips through the disposable interconnection board, whereby all user-defined signals from the FPGA chips are connected through the disposable interconnection board.

7. The hardware-based emulator of claim 6 wherein the connection receptacles are formed on the top of the wire-wrap posts, the wire-wrap posts extending through the second substrate, whereby the connection receptacles are an integral part of the wire-wrap posts.

8. The hardware-based emulator of claim 7 wherein the connection receptacles are small cups on the top of the wire-wrap posts.

9. The hardware-based emulator of claim 8 further comprising:

clamping means, connected to the disposable interconnection board and to the re-usable emulation board, for exerting pressure between the disposable interconnection board and the re-usable emulation board to force the connection terminals to firmly contact the connection receptacles, whereby the clamping means provides firm contact.

10. The hardware-based emulator of claim 7 wherein the connection receptacles are tightly-fitting plug receptacles, fitting tightly around the connection terminals when the disposable interconnection board is engaged with the re-usable emulation board.

11. A logic emulator comprising:

a first board having programmable logic chips mounted thereon;

a second board having a grid of wire-wrap posts mounted thereon;

connection means for connecting the first board to the second board during logic emulation;

download means, coupled to the programmable logic chips mounted on the first board, for programming user-defined logic gates for emulation to the programmable logic chips; and a plurality of wire-wrap wires connected between pairs of wire-wrap posts on the second board, the plurality of wire-wrap wires connected to wire-wrap posts to form user-defined external interconnect between the programmable logic chips when the connection means connects the first board to the second board, whereby the first board emulates the user-defined logic gates while the second board emulates the user-defined external interconnect.

12. The logic emulator of claim 11 wherein the ends of each wire-wrap wire are wound around a wire-wrap post to form an electrical connection to the wire-wrap post.

13. The logic emulator of claim 12 wherein the grid of wire-wrap posts matches in spacing and arrangement a grid of first connectors on the first board and a grid of second connectors on the second board, the connection means including the first connectors for connecting with the second connectors.

14. The logic emulator of claim 13 wherein the first connectors are connected to emulation I/O pins on the programmable logic chips, the emulation I/O pins coupled to inputs and outputs of the user-defined logic gates emulated by the programmable logic chips.

15. The logic emulator of claim 14 wherein the emulation I/O pins on any programmable logic chip are not directly connected on the first board to emulation I/O pins on any other programmable logic chip, wherein connections between emulation I/O pins are only made by the wire-wrap wires on the second board.

16. The logic emulator of claim 12 further comprising:

a memory module on the first board, the memory module for storing data, wherein the memory module on the first board is connected to the programmable logic chips through the wire-wrap wires on the second board.

17. The logic emulator of claim 11 wherein the first board comprises a plurality of first boards for connecting to a single second board, whereby electrical connection between the programmable logic chips on the plurality of first boards is made only by the wire-wrap wires on the second board.

18. A method for emulating a user-defined design of logic gates comprising the steps of:

reading a netlist of the user-defined design and mapping the logic gates to a plurality of re-programmable logic chips and writing a logic-gate mapping file;

generating an interconnection file from the netlist, the interconnection file specifing an external interconnection between the plurality of re-programmable logic chips necessary to emulate the user-defined design;

converting the interconnection file to pairs of x,y coordinates specifying locations of wire-wrap posts on a disposable interconnection board to be electrically connected together to form electrical interconnection;

wiring together wire-wrap posts identified by the x,y coordinates to form the electrical interconnection; and plugging an emulation board containing the plurality of re-programmable logic chips into the disposable interconnection board after wiring together the wire-wrap posts, wherein the electrical interconnection of the wire-wrap posts on the disposable interconnection board form the external interconnection specified by the interconnection file to electrically connect the plurality of re-programmable logic chips, whereby the external interconnection among the plurality of re-programmable logic chips is provided by the wire-wrap posts on the separate disposable interconnection board.

19. The method of claim 18 further comprising the step of:

downloading the logic-gate mapping file to the plurality of re-programmable logic chips and activating a programming sequence to program the user-defined design of logic gates into the re-programmable logic chips.

20. The method of claim 19 wherein the step of wiring together wire-wrap posts comprises:

stripping electrical insulation off a first end of a wire;

wrapping the first end of the wire around a first wire-wrap post;

routing the wire across the disposable interconnection board to a second wire-wrap post;

cutting the wire to form a second end and stripping the electrical insulation off the second end of the wire; and wrapping the second end of the wire around the second wire-wrap post.

21. The method of claim 20 wherein the step of wiring together wire-wrap posts is performed on an automated or semi-automated wire-wrap machine reading the interconnection file of x,y coordinates.

* * * * *